United States Patent
Ota

(10) Patent No.: US 9,437,414 B2
(45) Date of Patent: Sep. 6, 2016

(54) PATTERN FORMING DEVICE AND SEMICONDUCTOR DEVICE MANUFACTURING METHOD

(75) Inventor: Takumi Ota, Kanagawa-ken (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 797 days.

(21) Appl. No.: 13/607,276

(22) Filed: Sep. 7, 2012

(65) Prior Publication Data

US 2013/0221571 A1 Aug. 29, 2013

(30) Foreign Application Priority Data

Feb. 29, 2012 (JP) ................ P2012-043038

(51) Int. Cl.

| H01L 21/02 | (2006.01) |
|---|---|
| B29C 59/02 | (2006.01) |
| B29C 33/30 | (2006.01) |
| B29C 43/18 | (2006.01) |
| B29C 43/02 | (2006.01) |
| G03F 7/00 | (2006.01) |
| B29C 35/08 | (2006.01) |

(52) U.S. Cl.
CPC .............. *H01L 21/02* (2013.01); *B29C 33/30* (2013.01); *B29C 43/021* (2013.01); *B29C 43/18* (2013.01); *G03F 7/0002* (2013.01); *B29C 2035/0827* (2013.01)

(58) Field of Classification Search
CPC ... H01L 21/02; G03F 7/0002; B29C 43/021; B29C 43/18; B29C 33/10; B29C 2035/0827

USPC .............. 425/385, 174.4, 150; 264/293, 492, 264/493, 494, 495, 496

See application file for complete search history.

(56) References Cited

U.S. PATENT DOCUMENTS

| 6,228,294 B1 * | 5/2001 | Lee .................. B29C 33/60 264/322 |
|---|---|---|
| 6,870,301 B2 | 3/2005 | Choi et al. |
| 7,927,089 B2 | 4/2011 | Seki et al. |

(Continued)

FOREIGN PATENT DOCUMENTS

| JP | 2005-005284 | 1/2005 |
|---|---|---|
| JP | 2005109153 A | 4/2005 |

(Continued)

OTHER PUBLICATIONS

Japanese Office Action dated Jun. 19, 2014, filed in Japanese counterpart Application No. 2012-043038, 12 pages (with translation).

*Primary Examiner* — Nahida Sultana

(74) *Attorney, Agent, or Firm* — Patterson & Sheridan, LLP

(57) ABSTRACT

A pattern forming device uses a template having a plurality of protrusions and recesses configured to imprint a reverse image thereof on a resin on a substrate. The pattern forming device has a holding part, a stage, a driving part, and a curing part. The holding part includes a contact portion having a friction reducing contact portion, which is configured to engage against the template to hold the template. The stage carries the substrate. The driving part is configured to move at least one of the holding part and the stage to have the pattern in contact with the resin. The curing part cures the resin. The contact portion has a main body portion configured to move forward/backward with respect to the template and a tip portion arranged on the main body portion.

5 Claims, 11 Drawing Sheets

(56) References Cited

U.S. PATENT DOCUMENTS

| | | | |
|---|---|---|---|
| 7,946,837 B2* | 5/2011 | Kruijt-Stegeman | B82Y 10/00 264/293 |
| 8,033,814 B2 | 10/2011 | Bailey et al. | |
| 8,043,085 B2 | 10/2011 | Kruijt-Stegeman et al. | |
| 8,247,330 B2 | 8/2012 | Goto et al. | |
| 8,468,943 B2* | 6/2013 | Hiroshiro | B29C 37/0053 101/287 |
| 2006/0273488 A1* | 12/2006 | Seki et al. | 264/293 |
| 2008/0086877 A1* | 4/2008 | Kwak et al. | 29/850 |
| 2008/0160129 A1* | 7/2008 | Resnick | B82Y 10/00 425/385 |
| 2008/0241307 A1* | 10/2008 | Kishi | B29C 59/022 425/385 |
| 2010/0044917 A1* | 2/2010 | Kruijt-Stegeman | B82Y 10/00 264/293 |
| 2010/0166906 A1* | 7/2010 | Hashimoto | G11B 5/855 425/385 |
| 2010/0173033 A1* | 7/2010 | Bailey et al. | 425/174.4 |
| 2010/0297282 A1* | 11/2010 | De Schiffart et al. | 425/385 |
| 2010/0304280 A1 | 12/2010 | Hatano | |
| 2011/0001254 A1 | 1/2011 | Kruijt-Stegeman et al. | |
| 2011/0147989 A1* | 6/2011 | Song | B29C 59/026 264/293 |
| 2011/0147990 A1* | 6/2011 | Kim | B29C 59/026 264/293 |
| 2012/0152136 A1* | 6/2012 | Hiroshiro et al. | 101/287 |

FOREIGN PATENT DOCUMENTS

| | | |
|---|---|---|
| JP | 2008155522 A | 7/2008 |
| JP | 2008221552 A | 9/2008 |
| JP | 2009096193 A | 5/2009 |
| JP | 2010080918 A | 4/2010 |
| JP | 2011233652 A | 11/2011 |
| JP | 2012023092 A | 2/2012 |
| JP | 2013055097 A | 3/2013 |

* cited by examiner

PATTERN FORMING DEVICE AND SEMICONDUCTOR DEVICE MANUFACTURING METHOD

CROSS-REFERENCE TO RELATED APPLICATION

This application is based upon and claims the benefit of priority from Japanese Patent Application No. 2012-043038, filed Feb. 29, 2012; the entire contents of which are incorporated herein by reference.

FIELD

Embodiments described herein relate generally to a pattern forming device and a semiconductor device manufacturing method.

BACKGROUND

In recent years, a fine pattern forming technology known as the imprint method has been proposed. Using the imprint method, a pattern is formed on a light-transmissive substrate, such as fused silica or the like, using the electron beam lithographic method or the like. To form a three dimensional transfer pattern for imprinting on a transfer material, an electron beam etches embossed shapes on the surface of the fused silica or other substrate material substrate to form an imprint template therefrom. The template is then attached to the holding part of a pattern forming device. The substrate is then positioned on a stage of the pattern forming device to prepare for imprinting of a pattern thereon.

Next, drops of photocuring resin or some other pattern transfer substance are applied to the substrate, and the template is then brought into contact with the substance being imprinted. The substance being imprinted is held in this state until it fills the pattern of the template as a result of capillary action. Light is then irradiated from the back surface of the template to cure the substance being imprinted. The residual film of the substance being imprinted, which forms the pattern, is removed so that reverse of the embossed pattern on the template is imprinted onto the substrate to form a imprinted pattern on the transfer material, such as a photoresist, disposed on a surface of the substrate.

In pattern creation on a substrate, such as a substrate used in the fabrication of semiconductor devices, multiple layers of patterns must be formed on the substrate, to serve as masks for implanting and for the etching of patterns into the substrate and film layers formed on the substrate. These patterns must be aligned precisely, one over the other, to successfully fabricate the semiconductor device. Therefore, the pattern forming template must be precisely positioned on the substrate, and during curing, the position of the template must be properly maintained, in relation to the substrate, in order to provide a high quality three dimensional embossed pattern on the substrate. However, stresses in the substance being imprinted may, during curing, cause the template to move, which may cause defects, including position misalignment, in the embossed pattern being formed. Additionally, the template and members utilized to secure the template may slip with respect to one another, which causes particles to be generated which may fall onto the substrate and cause defects in the embossed pattern.

DETAILED DESCRIPTION

In general, according to one embodiment, the present invention will be explained with reference to these figures.

Here, the figures are schematic or conceptual figures. The relative thickness and width of each part and the ratio of size between different portions do not necessarily reflect the actual scale of the embodiment. Even when the same portion is represented in different figures, it may still be shown in different dimensions and ratios.

Also, the same keys as those above are adopted throughout the specification of the patent application and the various figures, and they will not be explained repeatedly in detail.

According to the embodiment, there is provided a pattern forming device and a semiconductor device manufacturing method that can improve manufacturing yield.

The pattern forming device according to an embodiment has a template including a substrate with side surfaces as well as a pattern arranged on the substrate in the reverse of the pattern of the protrusions and recesses to be formed in the resin formed on the substrate.

The pattern forming device has a holding part, a stage, a driving part, and a curing part.

The holding part includes a contact portion in contact with the template which holds the template.

The stage carries the substrate.

The driving part causes at least one of the holding part and the stage to move to have the pattern in contact with the resin.

The curing part cures the resin.

The contact portion has a main body portion that can move forward/backward with respect to the template, and a tip portion arranged on the main body portion.

The tip portion has plural protrusions, which do not touch each other but do come in contact with the side surface of the substrate.

(Embodiment 1)

Figure 1:
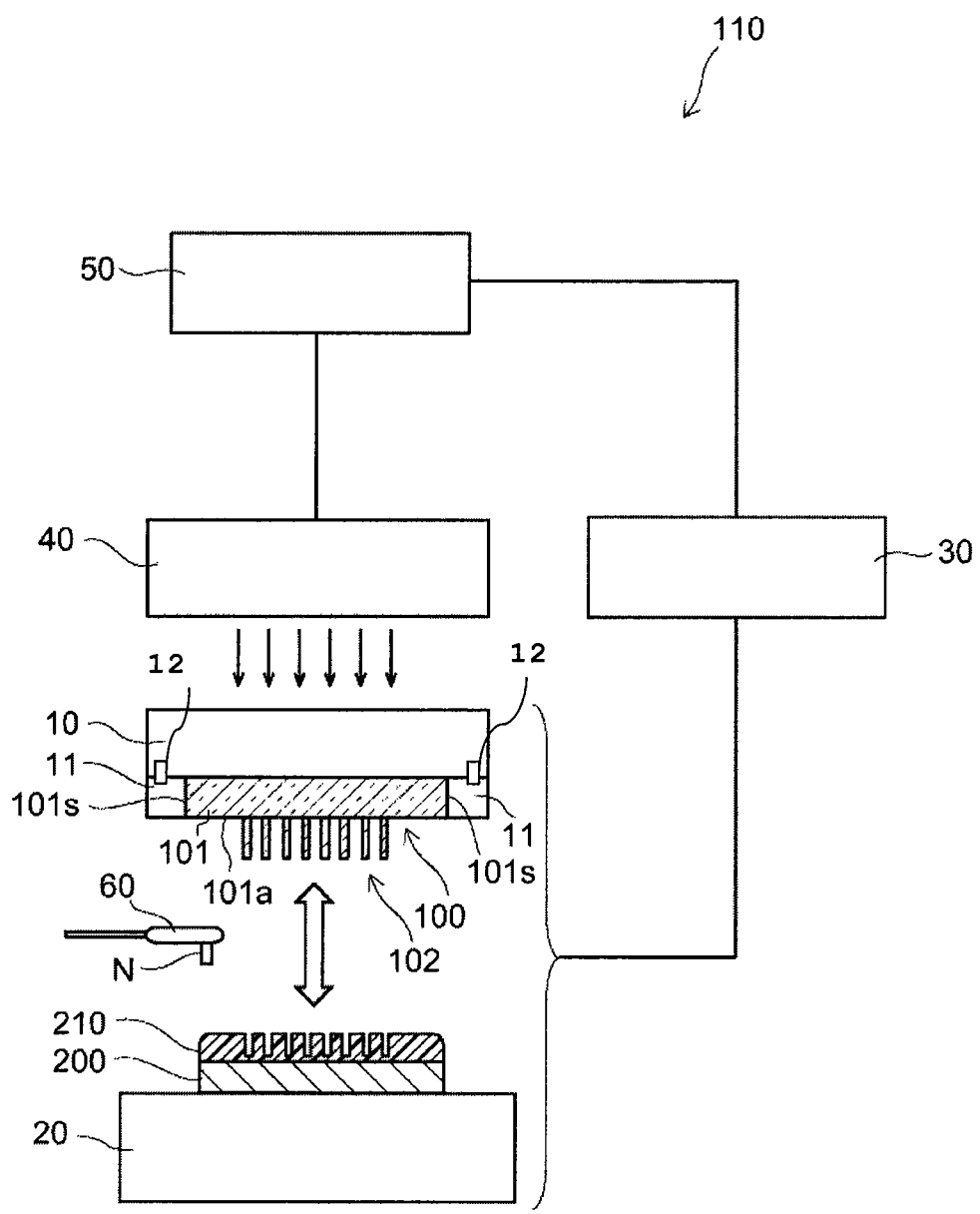
FIG. 1 is a schematic diagram illustrating an example of the constitution of the pattern forming device according to a first embodiment.

FIG. 1 is a schematic diagram illustrating one embodiment of a pattern forming device 110.

Figure 2:
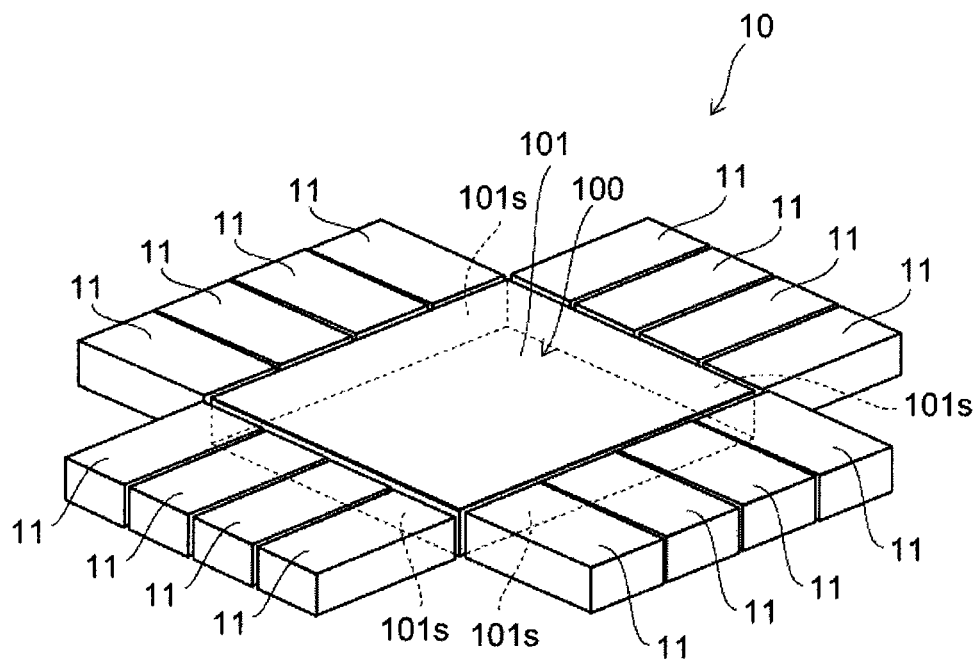
FIG. 2 is a schematic perspective view illustrating an example of the holding part.

FIG. 2 is a schematic perspective view illustrating an example of a holding part 10.

As shown in FIG. 1, pattern forming device 110 illustrated by this embodiment is an imprint device that uses a template 100, which includes a pattern 102 having a plurality of depressions and a plurality of protrusions, the shape of which is then imprinted into a resin 210 on the substrate to imprint thereon a reverse of the pattern of protrusions and recesses on the template 100.imprinted The template 100 adopted for use in the pattern forming device 110 includes a body 101 having side surfaces 101s and a pattern 102 arranged on a principal surface 101a of the body 101. The template 100 is an original plate for forming the pattern using the imprint method.

The pattern forming device 110 includes a holding part 10, a stage 20, a driving part 30, and a curing part 40. Also, the pattern forming device 110 may have a control part 50.

Referring now to FIGS. 1 and 2, the holding part 10 contains a plurality of contact portions 11 in contact with the template 100, which holds the template 100 during formation of the pattern on the transfer material in the substrate. For example, as shown on FIG. 2, the plural contact portions 11 are arranged to hold the pattern forming device 110 around the periphery of the template 100. The contact portions 11 contact the side surface 101s of the body 101. Thus, the template 100 is held about the periphery of the template 100 by the contact portions 11.

Alternatively or additionally, the holding part 10 may hold the template 100 by, for example, suctioning the side of the template 100 that is opposite to the pattern 102 of the body 101.

Referring again to FIG. 1, a stage 20 is positioned opposite the template 100 where the substrate 200 is positioned for an imprint process. The resin 210, which is the substance being imprinted, is coated on the substrate 200. Also, a coating part 60, including nozzle N that dispenses the resin 210 onto the substrate to receive the pattern thereon, may be arranged in the pattern forming device 110.

The driving part 30 causes at least one of the holding part 10 and the stage 20 to move, so that the pattern 102 and the resin 210 contact each other. A driving mechanism (not shown in the figure) is part of at least one of the holding part 10 and the stage 20. The driving part 30 uses the driving mechanism (not shown in the figure) that causes at least one of the holding part 10 and the stage 20 to move, changing the distance between the two parts.

The function of the curing part 40 is to cure the resin 210. When a photocuring resin is used as the resin 210, the curing part 40 has a light source (not shown in the figure) that emits light for curing the resin 210. Examples of light sources include high-pressure mercury lamps and lasers. When a thermal curing resin is adopted as the resin 210, the curing part 40 has a heating source (not shown in the figure) that generates heat for curing the resin 210.

The control part 50 controls the contact state between the pattern 102 and the resin 210 by means of the driving part 30. A measuring device (not shown in the figure) measures the distance between the template 100 and the substrate 200; based on this measurement, the control part 50 controls the driving mechanism of the driving part 30 to adjust the distance between the template 100 and the substrate 200.

Also, the control part 50 controls the holding pressure of the holding part 10 for stabilizing the template 100. For example, the contact portion 11 is set so that it can move forward/backward in a direction perpendicular to the side surface 101s of the body 101. The control part 50 controls the position of the contact portion 11, so that it adjusts where the contact portion 11 touches the side surface 101s, and also adjusts the amount of pressure with which the contact portion 11 will contact the side surface 101s. An actuator 12 associated with each of the contact portions 11 is utilized for providing movement of the respective contact portions 11 relative to the side surface 101s. In one embodiment, the actuator 12 is a piezoelectric actuator.

Also, the control part 50 controls curing of the resin 210 by the curing part 40. When a photocuring resin is used as the resin 210, the control part 50 controls the light source (not shown in the figure) of the curing part 40, which adjusts the light irradiation time. When a thermocuring resin is used as the resin 210, control part 50 controls the heating source (not shown in the figure) of the curing part 40, which adjusts the level of heat applied to the resin 210.

The control part 50 also may control forward/backward movement of the nozzle N of the coating part 60 and the quantity of the resin 210 applied by the nozzle N. Also, the control part 50 may control the amount of suction, or the like, that holds together the substrate 200 and the stage 20.

The following paragraphs explain various examples of the holding part.

As shown in FIG. 2, the contact portion 11 of the holding part 10 is arranged to face the side surface 101s of the body 101 of the template 100, for example. The rectangular shaped body 101 has four side surfaces 101s. On each side surface 101s, for example, plural contact portions 11 are arranged. In the example shown in FIG. 2, four contact portions 11 are arranged to face each side surface 101s. That is, the template 100 is held by the contact portions 11 (a total of 16 contact portions 11) facing the four side surfaces 101s, respectively.

While holding the template 100, the holding part 10 uses the contact portions 11 to press the side surfaces 101s of the body 101 to adjust the pressure applied to side surfaces 101s and/or the position of the contact portions with respect to the side surfaces 101a of the template 100. That is, by means of the balance of the stresses applied from the contact portions 11 arranged on the periphery of the template 100 towards the side surfaces 101s, the strain correction of the template 100 and the magnification (i.e., the contraction rate when the pattern shape is imprinted) are adjusted.

Figure 3A:
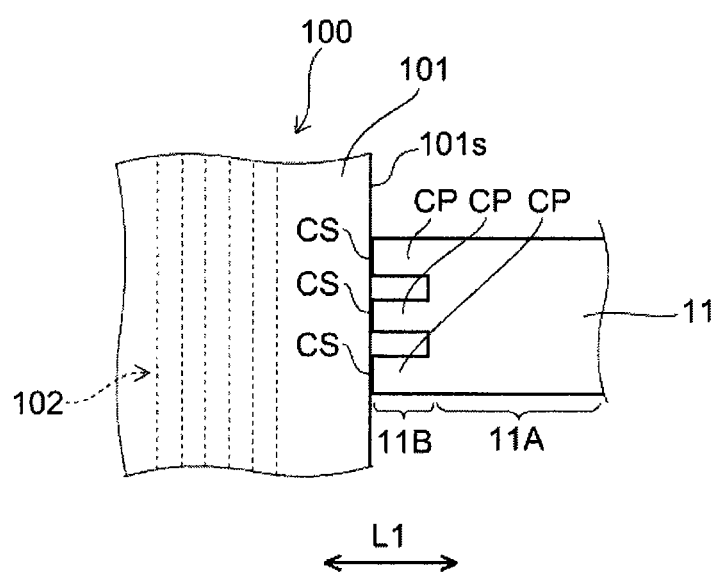
FIG. 3A and FIG. 3B are schematic diagrams illustrating an example of the constitution of the contact portion.
Figure 3B:
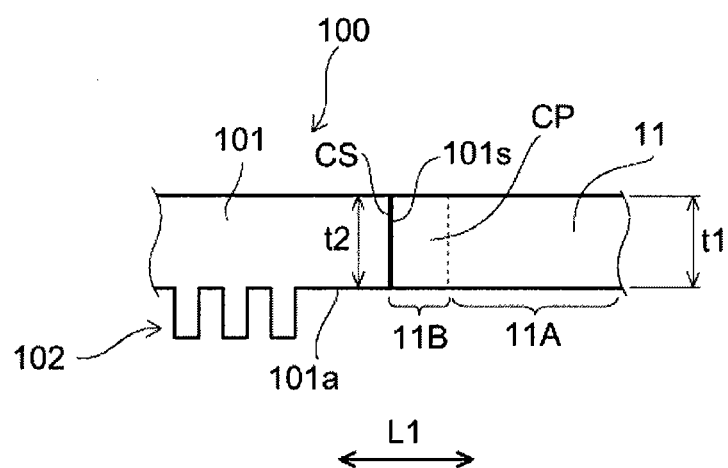

FIG. 3A is an enlarged schematic plane view of one contact portion 11. FIG. 3B is an enlarged schematic side view of one contact portion 11.

The contact portion 11 has the following sub-portions: main body portion 11A, which moves forward/backward with respect to the template 100, and tip portion 11B arranged on the main body portion 11A. For example, the main body portion 11A contains an actuator (shown in FIG. 1). The tip portion 11B has plural contact surfaces CS arranged separately from each other on the surface facing and fitting the side surface 101s. That is, plural protrusions CP are arranged on the tip portion 11B, and the tip surfaces of the protrusions CP become the contact surfaces CS.

In the example shown in FIG. 3A, three protrusions CP are arranged side by side with a prescribed spacing in the longitudinal direction of the side surface 101s, and each protrusion is separated from the adjacent protrusion by a gap.

Preferably, the external dimension of the tip portion 11B, as viewed in a normal direction L1 of the contact surface CS, should be equal to the external dimension of the main body portion 11A as viewed in the normal direction L1. That is, it is preferable that the contact portion 11 be arranged with the same external dimension from the main body portion 11A to the tip portion 11B, such that the wall of a tip portion protrusions CP adjacent an outer wall of the contact potion are formed of a continuation of that wall, and no step of other dimensional change is present. As a result, when the contact portion 11 contacts the side surface 101s, the force can be reliably transferred from the main body portion 11A via the tip portion 11B to the side surface 101s without inducing higher stresses where the protrusions CP of the portion 11B blend into portion 11A.

Also, it is preferable that a thickness t1 of the tip portion 11B be substantially equal to a length t2 of the side surface 101s in the thickness direction. In one example, the thickness t1 and length t2 may be about 6 mm, although thickness t1 may be slightly less than 6 mm. As a result, the contact portion 11 contacts the entirety of the side surface 101s in the thickness direction, and the force can be transferred reliably to the side surface 101s. However, on the transverse direction, which is the direction perpendicular to the thickness direction of the template body side surface 101, there are alternating gaps between adjacent protrusions CP where no contact is made between the contact portion 11 and the side surface 101, enabling bending movement within the protrusions CP to compensate for thermal or loading moment on the interface with a lower likelihood of rubbing contact which would generate unwanted particles. Moreover, by providing a n equal area of contact to either side of the midpoint of the protrusions, the contact pressure will still be uniformly applied to the side of the template 100, whereas is a smaller single protrusion, having the same contact area as multiple protrusions CP were employed, there is a possibility that the template mat cock or twist as the pressure is applied.

With respect to the pattern forming device 110 having the contact portion 11, as the template 100 is held in the holding part 10, the contact area of the contact portion 11 with the side surface 101s becomes smaller, because of the gaps between adjacent protrusions CP. As a result, it is possible to alleviate the problem of foreign objects falling off when the contact portion 11 touches the side surface 101s because the contact area over which particles can be created by rubbing contact is reduced.

That is, according to the present embodiment, plural protrusions CP are arranged on the tip portion 11B of the contact portion 11. As the contact surface CS of each of the protrusions CP touches the side surface 101s, the contact area of the contact portion 11 with the side surface 101s becomes smaller than that when the main body portion 11A of the contact portion 11 touches the side surface 101s as it is.

Here, as the contact area of the contact portion 11 with the side surface 101s becomes wider, due to contact between the contact portion 11 and the side surface 101s, the probability of foreign objects falling off becomes higher. Because the substrate 200 and the resin 210 are arranged beneath the template 100, there is a high probability that the fallen foreign objects will adhere to the substrate 200 and the resin 210. If an imprint is carried out by the template 100 while the foreign objects are adhered to the substrate 200 and resin 210, the foreign objects become sandwiched between the template 100 and the substrate 200. This can damage the template 100 and cause defective patterns to be imprinted to the resin 210.

According to the present embodiment, as the contact area of the contact portion 11 with the side surface 101s is decreased, and the probability of foreign objects falling off due to contact of the contact portion 11 with the side surface 101s is reduced. As a result, it is possible to limit or eliminate problems such as damage to the template 100 and defective imprinted pattern.

On the other hand, it is believed that the contact area of the contact portion 11 on the side surface 101s of the body 101 (such as point contact) is extremely small. If the contact area of the point contact, or the like, is too small, when pressure is applied from the contact portion 11 locally on the side surface 101s, it may lead to defects in or damage to the template 100.

According to the present embodiment, by means of face contact for the contact portion 11 on the side surface 101s of body 101, it is possible to disperse the pressure distribution, while the contact area is smaller than that when the main body portion 11A contacts the side surface 101s as it is. Consequently, it is possible to realize both the following effects: (1) reliable pressing of the template 100 by the contact portion 11, and (2) reduction of foreign objects falling off due to contact between the contact portion 11 and the side surface 101s.

Due to effect (1), it is possible to appropriately correct for the strain as well as the magnification for the template 100; it is also possible to improve the mapping precision of the pattern 102. On the other hand, due to effect (2), it is possible to suppress the amount of foreign objects that fall on the imprinted pattern, which in turn increases the yield in pattern formation.

Figure 4A:
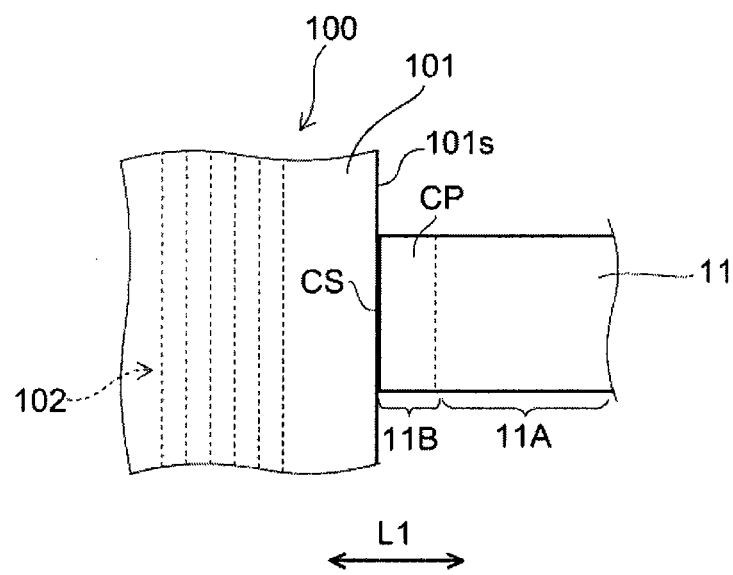
FIG. 4A and FIG. 4B are schematic diagrams illustrating another example (first example) of the contact portion.
Figure 4B:
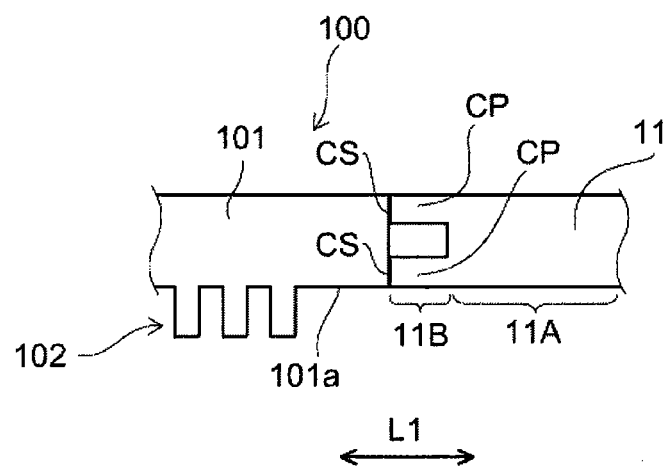

FIG. 4A and FIG. 4B are schematic diagrams illustrating another example (the first example) of the contact portion.

FIG. 4A is an enlarged schematic plane view illustrating one contact portion 11. FIG. 4B is an enlarged side view illustrating one contact portion 11.

In the contact portion 11 shown in FIG. 4A and FIG. 4B, the configuration of the protrusions CP on the tip portion 11B is different from that of the contact portion 11 shown in FIG. 3A and FIG. 3A.

That is, on the tip portion 11B shown in FIG. 4A and FIG. 4A, plural protrusions CP are formed with a prescribed spacing in the lateral direction of the side surface 101s, such that the protrusion orientation is perpendicular to that of the protrusions CP in FIGS. 3A and 3B. In the example shown in FIG. 4A and FIG. 4B, two protrusions CP are arranged. The two protrusions CP are arranged with a prescribed spacing between them in the lateral direction of the side surface 101s.

Figure 5A:
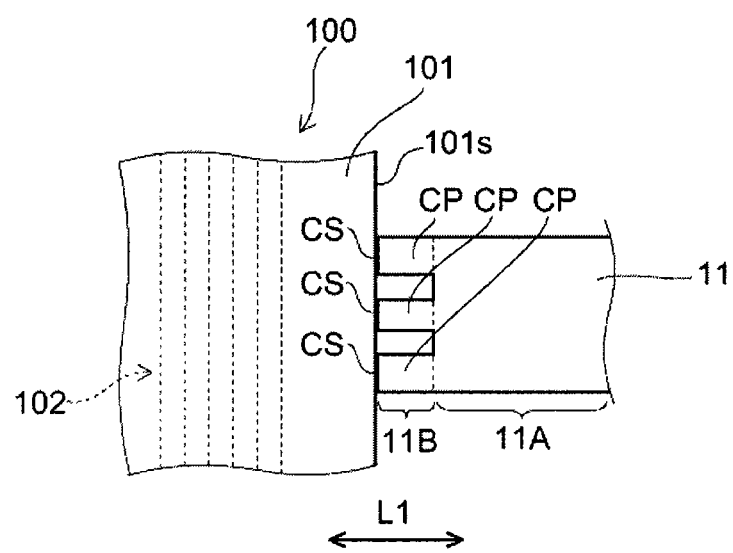
FIG. 5A, FIG. 5B and FIG. 5C are schematic diagrams illustrating another example (second example) of the contact portion.
Figure 5B:
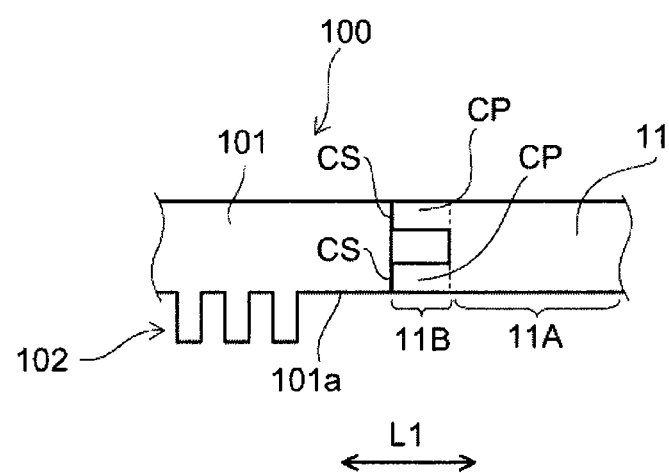
Figure 5C:
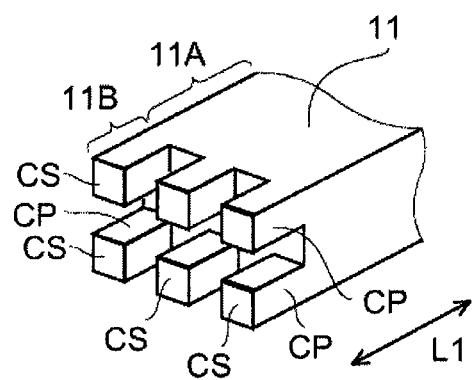

FIG. 5A through FIG. 5C are schematic diagrams illustrating another example (the second example) of the contact portion.

FIG. 5A is an enlarged schematic plane view illustrating the engagement of the protrusions CP of a single contact portion 11 with side surface 101s of template 100. FIG. 5B is an enlarged schematic side view illustrating the engagement of the protrusions of the contact portion 11 shown in FIG. 5A with the side surface 101s of template 11, and FIG. 5C is an enlarged schematic perspective view illustrating the protrusions of the contact portion 11 shown in FIGS. 5A and 5B.

In the contact portion 11 shown in FIG. 5A through FIG. 5C, plural protrusions CP on the tip portion 11B are arranged side by side with a prescribed spacing in both the longitudinal direction and lateral direction of the side surface 101s.

In the example shown in FIG. 5A through FIG. 5C, six protrusions CP are arranged. The six protrusions CP are arranged side by side, with two arranged with a prescribed spacing in the lateral direction of the side surface 101s, and with three arranged with a prescribed spacing in the longitudinal direction of the side surface 101s. Again, the area of the end faces of the protrusions CP are symmetric with respect to the center of the end of the contact portion 11

For the contact portion 11 shown in FIG. 4A through FIG. 5C, effects (1) and (2) can both be realized. Due to effect (1), it is possible to appropriately correct both the strain and the magnification for the template 100, so that the precision of the mapping of the pattern 102 is improved. Also, according to effect (2), it is possible to limit the amount of foreign objects that fall on the mapping pattern, which in turn increases the pattern forming yield.

However, the number and configuration of the protrusions CP are not limited by these examples.

The shape of the contact surface CS, in addition to being a rectangular shape, may also be polygonal, round, elliptical, annular, etc. In addition, there may be two or more sizes of the various contact surfaces CS.

(Embodiment 2)

Figure 6A:
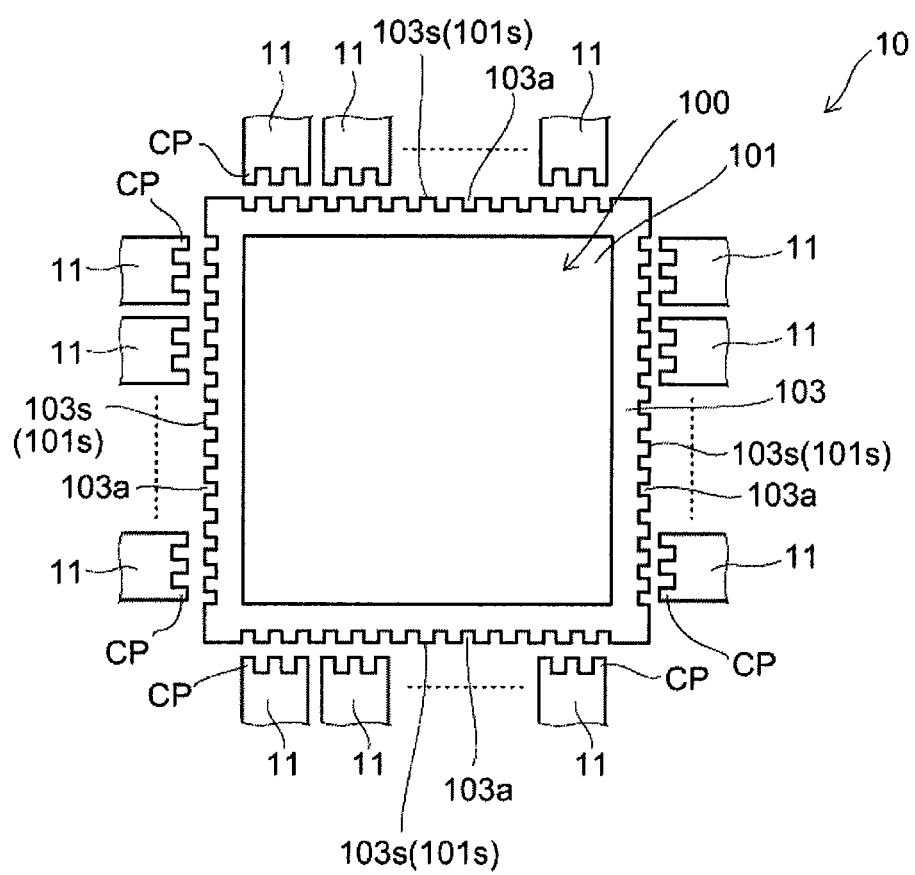
FIG. 6A and FIG. 6B are schematic diagrams illustrating an example of the pattern forming device according to a second embodiment.
Figure 6B:
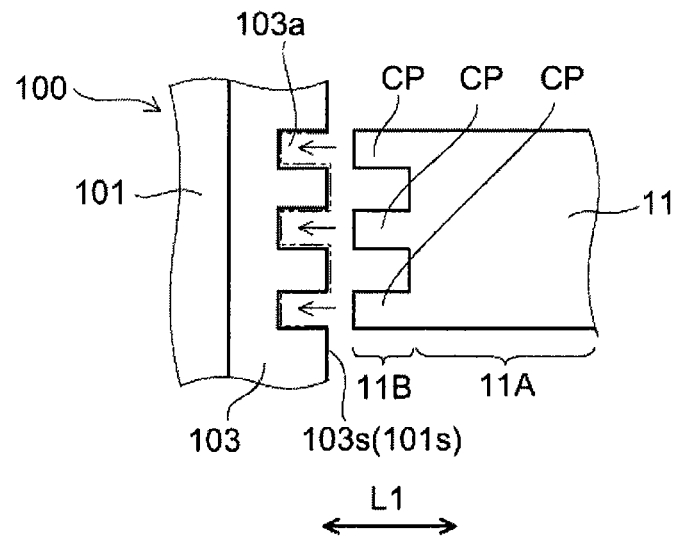

FIG. 6A and FIG. 6B are schematic diagrams illustrating an example of the holding part of the pattern forming device according to Embodiment 2.

FIG. 6A is a schematic plan view illustrating the holding part 10 and template 100. FIG. 6B is an enlarged schematic plan view illustrating a single contact portion 11 with a side wall 103a of the template 100.

The pattern forming device according to Embodiment 2 is the same as that of the pattern forming device 110 of Embodiment 1 (see FIG. 1), except for the constitution of the holding part 10.

As shown in FIG. 6A, the holding part 10 includes the contact portion 11 that contacts the template 100. As shown in FIG. 6B, the contact portion 11 includes the main body portion 11A that can move forward/backward with respect to the template 100, and the tip portion 11B arranged on the main body portion 11A. The tip portion 11B has plural contact surfaces CS arranged separately from each other. That is, on the tip portion 11B, plural protrusions, such as protrusions CP, are arranged, and the tip surface of each of the protrusions CP becomes the contact surface CS.

As shown in FIG. 6A, a frame portion 103 is arranged on the outer edge of the template 100. On an outer peripheral surface 103s of the frame portion 103, concave portions, in the form of notches or depressions 103a are arranged. According to the present embodiment, the outer peripheral surface 103s of the frame portion 103 corresponds to the side surface 101s of the body 101 of the template 100.

On the holding part 10, for example, plural contact portions 11 are arranged around the periphery of the frame portion 103 set on the outer edge of the template 100. The contact portions 11 contact the outer peripheral surface 103s of the frame portion 103. According to the present embodiment, when the template 100 is held by the holding part 10, the protrusions CP of the tip portion 11B of the contact portion 11 fit into the recesses 103a arranged around the outer peripheral surface 103s of the frame portion 103.

In this way, when the template 100 is held by the holding part 10, because the protrusions CP of the tip portion 11B fit into the protrusions 103a of the frame portion 103, it is possible to suppress deviation between the outer peripheral surface 103s of the frame portion 103 and the contact portion 11. As a result, when the template 100 is held, friction between the outer peripheral surface 103s and the contact portion 11 can be suppressed, and it is thus possible to realize both of effects (1) and (2) simultaneously.

According to effect (1), the strain and magnification of the template 100 can be appropriately corrected, which in turn improves the precision of the pattern 102. In addition, according to effect (2), it is possible to limit the amount of foreign objects that fall on the mapping pattern, which increases the pattern forming yield.

The shape of the tip portion 11B shown in FIG. 6A and FIG. 6B is merely an example of the shape of the tip portion 11B shown in FIG. 3A and FIG. 3B. The shape of the tip portion 11B shown in FIGS. 4A through 5C may also be adopted. In this case, the protrusions 103a of the frame portion 103 that fit the shape of the tip portion 11B are arranged along the outer peripheral surface 103s.

In the example shown in FIG. 6A and FIG. 6B, the frame portion 103 is arranged on the outer edge of the template 100, and the protrusions 103a are arranged on the frame portion 103. However, the protrusions 103a may also be directly formed on the side surface 101s of the body 101 of the template 100.

(Embodiment 3)

Figure 7A:
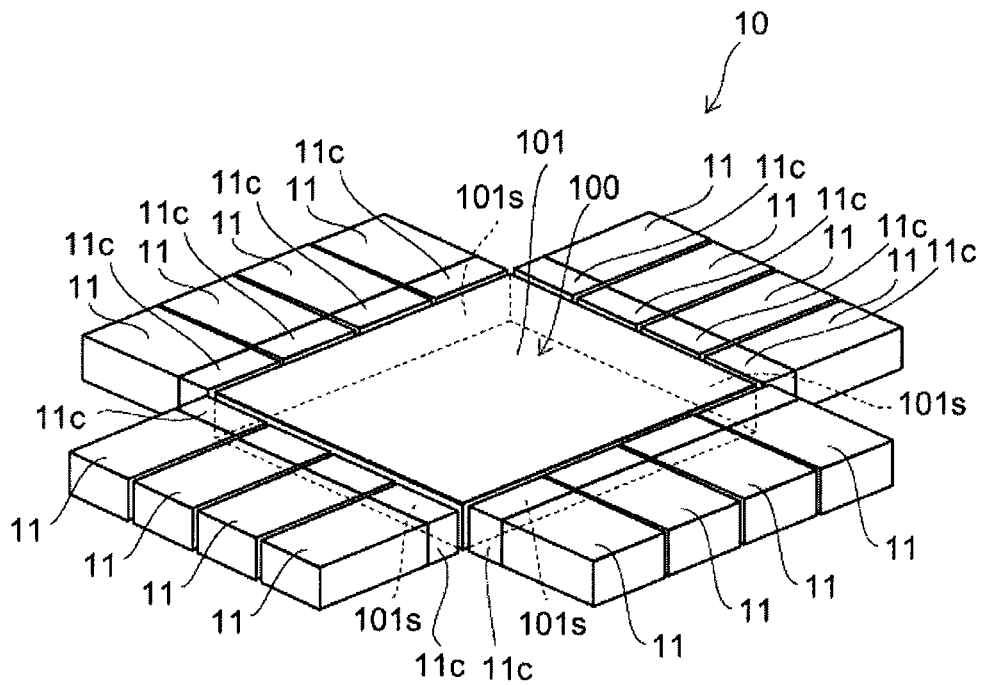
FIG. 7A and FIG. 7B are schematic diagrams illustrating an example of the holding part of the pattern forming device according to a third embodiment.
Figure 7B:
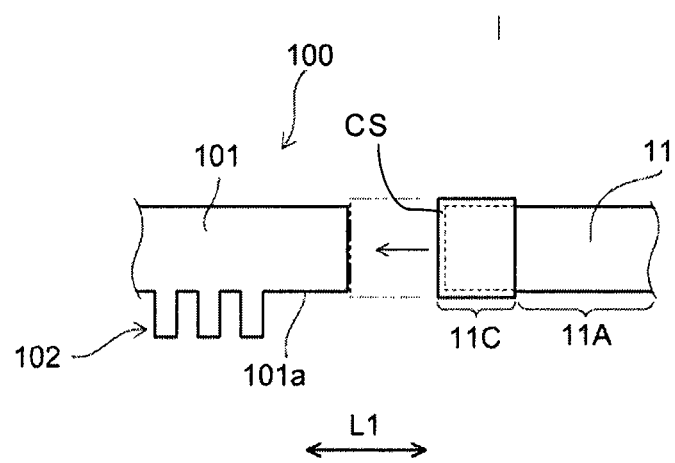

FIG. 7A and FIG. 7B are schematic diagrams illustrating an example of the holding part of the pattern forming device according to Embodiment 3.

FIG. 7A is a schematic perspective view illustrating the holding part 10, and FIG. 7B is an enlarged schematic side view illustrating one contact portion 11.

The pattern forming device according to Embodiment 3 has the same structure as the pattern forming device 110 according to Embodiment 1 (see FIG. 1), except for the constitution of the holding part 10.

As shown in FIG. 7A, the holding part 10 includes the contact portion 11 in contact with the template 100. As shown in FIG. 7B, the contact portion 11 includes a main body portion 11A that can move forward/backward with respect to the template 100, and a tip portion 11C arranged on the main body portion 11A.

The contact friction between the contact surface CS of the tip portion 11C and the side surface 101s is lower than the contact friction in the case where the main body portion 11A contacts the side surface 101s. For example, a coating of fluororesin is applied to the tip portion 11C. The fluororesin is exposed on the contact surface CS.

For example, plural contact portions 11 are arranged on the holding part 10 to surround the periphery of the template 100. The plural contact portions 11 contact the side surface 101s of the body 101. According to the present embodiment, the contact surface CS of the tip portion 11C contacts the side surface 101s. Because the fluororesin is exposed on the contact surface CS, the contact friction can be decreased compared to the case of direct contact between the main body portion 11A and the side surface 101s.

According to the present embodiment, when the template 100 is held in the holding part 10, it is possible to decrease the contact friction between the contact portion 11 and the template 100. This in turn alleviates the problem of foreign objects generated by friction between the template 100 and the contact portion 11 falling onto the template. Consequently, it is possible to limit the amount of foreign objects that fall on the imprinted pattern, which in turn increases the pattern forming yield.

Coating of the fluororesin, or the like, may also be carried out on the main body portion 11A, other than the tip portion 11C. In addition to coating of the fluororesin, or the like, it is also possible to use a material different from the material of the main body portion 11A as the material for the tip portion 11C in order to decrease the contact friction of the tip portion 11C. Moreover, coating of the fluororesin, or the like, may be carried out a as single-layer coating or multi-layer coating.

(Embodiment 4)

The following paragraphs explain the pattern forming method according to Embodiment 4.

FIG. 8A through FIG. 9C are schematic cross-sectional views illustrating the pattern forming method according to Embodiment 4.

FIG. 8A through FIG. 9C illustrate an example of a manufacturing semiconductor device 300, using the pattern forming method according to the present embodiment.

Figure 8A:
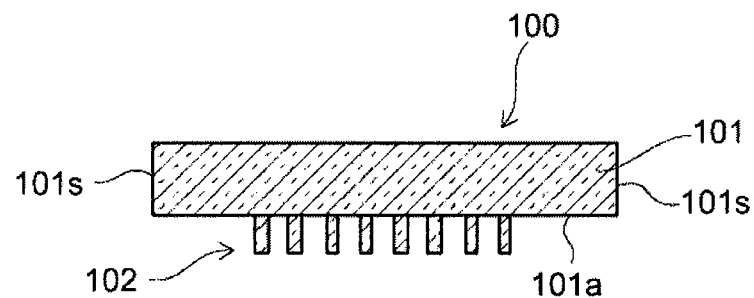
FIG. 8A, FIG. 8B and FIG. 8C are schematic cross-sectional views illustrating an example of the pattern forming method according to a fourth embodiment.

First of all, as shown in FIG. 8A, the template 100 is prepared. Here, the template 100 includes the body 101 having the side surfaces 101s, and the pattern 102 arranged on the principal surface 101a of the body 101. The body 101 is made of fused silica or some other light transmissive material. For example, the pattern 102 may be the reverse image of a resist pattern which is formed on the body 101 by means of electron beam lithography. With the resist pattern used as a mask, etching is carried out, so that an embossed shape is formed for the principal surface 101a of the body 101.

Figure 8B:
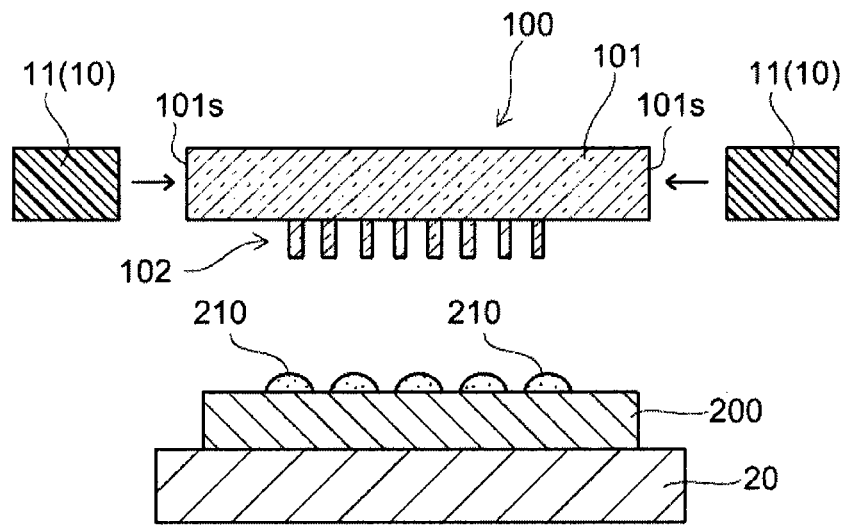

Then, as shown in FIG. 8B, the template 100 is attached to the holding part 10 of the pattern forming device 110. Here, any type of holding part 10 explained above may be adopted. In order to hold the template 100, the contact portion 11 of the holding part 10 contacts the side surface 101s of the body 101 of the template 100. By applying the holding part 10 which is explained above, it is possible to limit the amount of foreign objects that fall off when the contact portion 11 contacts the side surface 101s.

The substrate 200 is positioned on the stage 20 of the pattern forming device 110. For example, the substrate 200 may be a semiconductor substrate (silicon wafer or the like). The substrate 200 may also be prepared by forming a semiconductor layer on an insulating substrate. Transistors and other elements may be formed on the substrate 200.

Then, drops of resin 210 as the substance being imprinted are applied to the substrate 200. Here, the resin 210 may be a photocuring resin or a thermocuring resin. The resin 210 is ejected from the nozzle N (see FIG. 1) onto the substrate 200.

Figure 8C:
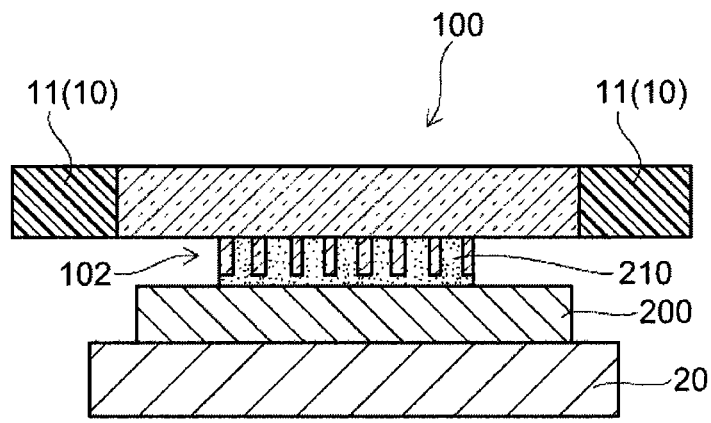

Then, as shown in FIG. 8C, the template 100 is brought into contact with the resin 210. The resin 210 is held in this state until it fills the interior of the pattern 102 of the template 100 by means of capillary action.

Figure 9A:
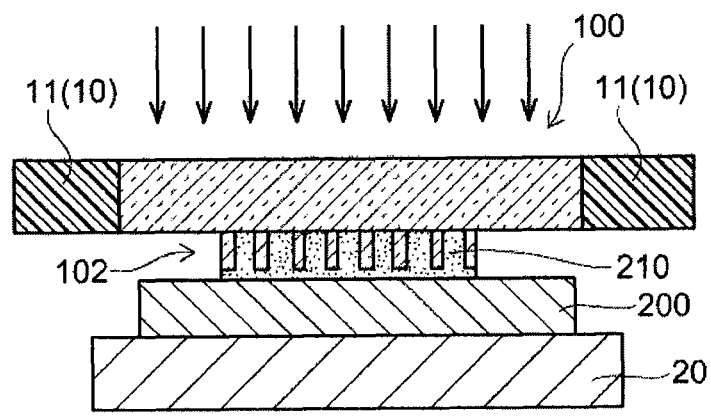
FIG. 9A, FIG. 9B and FIG. 9C are schematic cross-sectional views illustrating an example of the pattern forming device according to a fourth embodiment.

Then, as shown in FIG. 9A, while the template 100 is in contact with the resin 210, the resin 210 is cured. When the resin 210 is a photocuring resin, it is cured by being irradiated with light. For a resin that cures under irradiation of UV light, UV light is used to irradiate the resin. On the other hand, when the resin 210 is a thermocuring resin, it is heated and cured.

Figure 9B:
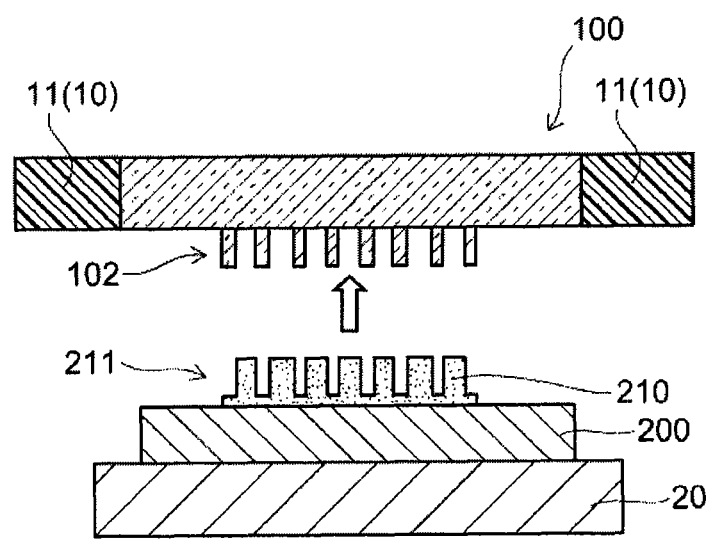

Then, as shown in FIG. 9B, after curing of the resin 210, the template 100 is released from the resin 210. As a result, an imprinted pattern 211 is embossed by the pattern 102 that the template 100 formed in the resin 210.

Figure 9C:
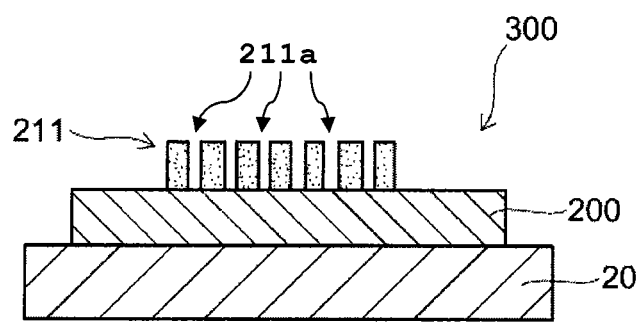

Finally, as shown in FIG. 9C, the film of the resin 210 left in depressions 211a of the imprinted pattern 211 is removed. Formation of the imprinted pattern 211 is part of the manufacturing process for a semiconductor device 300, because the imprinted pattern 211 may form a part of the semiconductor device 300. One may also adopt a scheme in which the imprinted pattern 211 is used as a mask to etch the base material (substrate 200 or the like) and then removed.

In the manufacturing method, while the template 100 is held by the holding part 10, the falling off of foreign objects as a result of contact between the contact portion 11 and the template 100 can be suppressed. Consequently, it is possible to alleviate the problem of foreign objects sticking to the substrate 200 and the resin 210 arranged beneath the template 100. As a result, it is possible to form the imprinted pattern 211 very precisely and with a high yield, free of foreign objects.

As explained above, by using the pattern forming device and the semiconductor device manufacturing method according to the embodiment, it is possible to increase the manufacturing yield of the pattern and the semiconductor device.

While certain embodiments and its modified examples have been described, these do not limit the present invention. For example, with respect to the embodiment and its modified examples, specialists can make appropriate additions, deletions, changes in design, etc., of the composing requirements in order to make appropriate combinations of the various embodiments. As long as the gist of the present invention is observed, various modifications are also included in the range of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming device, which uses a template having a body with side surfaces, and a pattern arranged on a major surface of the body and having a plurality of depressions and a plurality of protrusions formed thereon to map the shape of the pattern to a resin on a substrate, the pattern forming device comprising:
a holding portion configured to hold the body and being positionable adjacent to a major surface of the body opposite the major surface having the pattern, the holding portion having at least two independently moveable contact portions that are positioned and arranged to engage a side surface of the template through a contact friction reducing film, each of the at least two independently moveable contact portions has at least two protruding portions separated by a gap there between, and the at least two independently moveable contact portions are each coupled to an actuator, and the actuators move the at least two independently moveable contact portions relative to the body.

2. The pattern forming device of claim 1, wherein the actuator comprises a piezoelectric actuator.

3. The pattern forming device of claim 1, wherein the at least two protruding portions comprise a plurality of protrusions arrayed symmetrically.

4. The pattern forming device of claim 3, wherein the side surface of the template includes at least one recess into which one of the at least two protruding portions may be received during engagement of the at least two independently moveable contact portions and the template.

5. The pattern forming device of claim 1, wherein the contact friction reducing portion film comprises a fluororesin film formed thereon.

* * * * *